(12) United States Patent
Araki

(10) Patent No.: US 11,163,186 B2
(45) Date of Patent: Nov. 2, 2021

(54) DISPLAY DEVICE

(71) Applicant: Mitsubishi Electric Corporation, Tokyo (JP)

(72) Inventor: Yasuhiro Araki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/728,893

(22) Filed: Dec. 27, 2019

(65) Prior Publication Data
US 2020/0233258 A1 Jul. 23, 2020

(30) Foreign Application Priority Data

Jan. 23, 2019 (JP) .............................. JP2019-009061

(51) Int. Cl.
| | |
|---|---|
| *G02F 1/1333* | (2006.01) |
| *H05K 5/00* | (2006.01) |
| *H05K 5/03* | (2006.01) |

(52) U.S. Cl.
CPC ..... *G02F 1/133308* (2013.01); *H05K 5/0017* (2013.01); *H05K 5/03* (2013.01); *G02F 1/13332* (2021.01); *G02F 1/133317* (2021.01); *G02F 1/133331* (2021.01); *G02F 2202/28* (2013.01)

(58) Field of Classification Search
CPC .................................................... G02F 1/1333
See application file for complete search history.

(56) References Cited

U.S. PATENT DOCUMENTS

| | | | |
|---|---|---|---|
| 9,872,407 B2 | 1/2018 | Inobe et al. | |
| 2014/0092340 A1* | 4/2014 | Jeong ................... | G02B 6/0086 349/60 |
| 2014/0232969 A1 | 8/2014 | Tsubaki et al. | |
| 2015/0253615 A1* | 9/2015 | Ryu .................. | G02F 1/133512 349/58 |
| 2018/0113352 A1 | 4/2018 | Arita | |

FOREIGN PATENT DOCUMENTS

| | | |
|---|---|---|
| JP | 2004-012904 A | 1/2004 |
| JP | 2014-160218 A | 9/2014 |
| JP | 2015-102668 A | 6/2015 |
| JP | 2015-165264 A | 9/2015 |
| JP | 6294967 B2 | 3/2018 |
| JP | 2018-072463 A | 5/2018 |

OTHER PUBLICATIONS

An Office Action mailed by the Japanese Patent Office dated Aug. 10, 2021, which corresponds to Japanese Patent Application No. 2019-009061 and is related to U.S. Appl. No. 16/728,893; with English language translation.

* cited by examiner

*Primary Examiner* — Jerry Wu
(74) *Attorney, Agent, or Firm* — Studebaker & Brackett PC

(57) ABSTRACT

An object of the present disclosure is to provide a display device capable of improving productivity. A display device according to the present disclosure includes a display panel, a protective member disposed on a display surface of the display panel via a bonding material and an outer periphery thereof protruding from the display panel, and a frame enclosing the display panel and supporting the outer periphery of the protective member from lower side which is on a side of the display panel. The frame has a concave portion cut out from a portion of a surface in contact with the protective member toward an outer side surface. In the concave portion, an adhesive adhering the protective member and the frame together is filled.

6 Claims, 7 Drawing Sheets

DISPLAY DEVICE

BACKGROUND OF THE INVENTION

Field of the Invention

The present disclosure relates to a display device including a protective member on a display surface of a display panel.

Description of the Background Art

Display devices including a resin or glass protective member having robustness on the display surface of a display panel are widely used. In such a display device, in order to prevent deterioration of visibility due to surface reflection of external light and protect the display device from external impact, water permeation, dust and the like, there is a structure in which the display surface member of the display panel and the touch panel or a protective are integrated by using a glass bonding (GB) technique in which bonded is performed with a transparent resin.

Also, there is a structure in which a display panel and a protective member are fixed with a double-sided bonding tape. However, in order to fix the display panel and the protective member with the double-sided bonding tape, a place where the double-sided bonding tape is provided is required which does not contribute to narrowing of a frame of the display device.

Conventionally, there has been disclosed a technique capable of increasing the bonding area between the cover and the cabinet by providing a concave portion on the upper surface of the cabinet and maintaining the bonding strength between the cover and the cabinet (see Japanese Patent No. 6294967, for example).

There has been a problem in Japanese Patent No. 6294967, in that an adhesive may permeate inside of the display device when a low-viscosity adhesive is used during conveyance to the next process in the manufacturing processing of the display device because a gap is provided between the cover and the cabinet. In addition, the adhesive has a low adhesive force immediately before being cured immediately after application; therefore, there has been a problem in that the cover may fall off during conveyance when conveying to the next process before the adhesive is cured in the manufacturing processing of the display device. Thus, in Japanese Patent No. 6294967, it cannot be said that the productivity of the display device is high.

SUMMARY

An object of the present disclosure is to provide a display device capable of improving productivity.

A display device according to the present disclosure includes a display panel, a protective member disposed on a display surface of the display panel via a first bonding member and an outer periphery thereof protruding from the display panel, and a frame enclosing the display panel and supporting the outer periphery of the protective member from lower side which is on a side of the display panel. The frame has a concave portion cut out from a portion of a surface in contact with the protective member toward an outer side surface. In the concave portion, an adhesive adhering the protective member and the frame together is filled.

The display device includes the frame enclosing the display panel and supporting the outer periphery of the protective member from the lower side which is the display panel side, the frame has the concave portion cut out from a portion of a surface in contact with the protective member toward the outer side surface, and the concave portion is filled with an adhesive that adheres the protective member and the frame together. Therefore, productivity can be improved.

These and other objects, features, aspects and advantages of the present disclosure will become more apparent from the following detailed description of the present disclosure when taken in conjunction with the accompanying drawings.

DESCRIPTION OF THE PREFERRED EMBODIMENTS

Embodiments of the present disclosure will be described below with reference to the drawings. Note that the display device described below is assumed to be a liquid crystal display device. Also, components using the same symbol in each Embodiment shall be provided with the same or substantially the same function.

Embodiment 1

Figure 1:
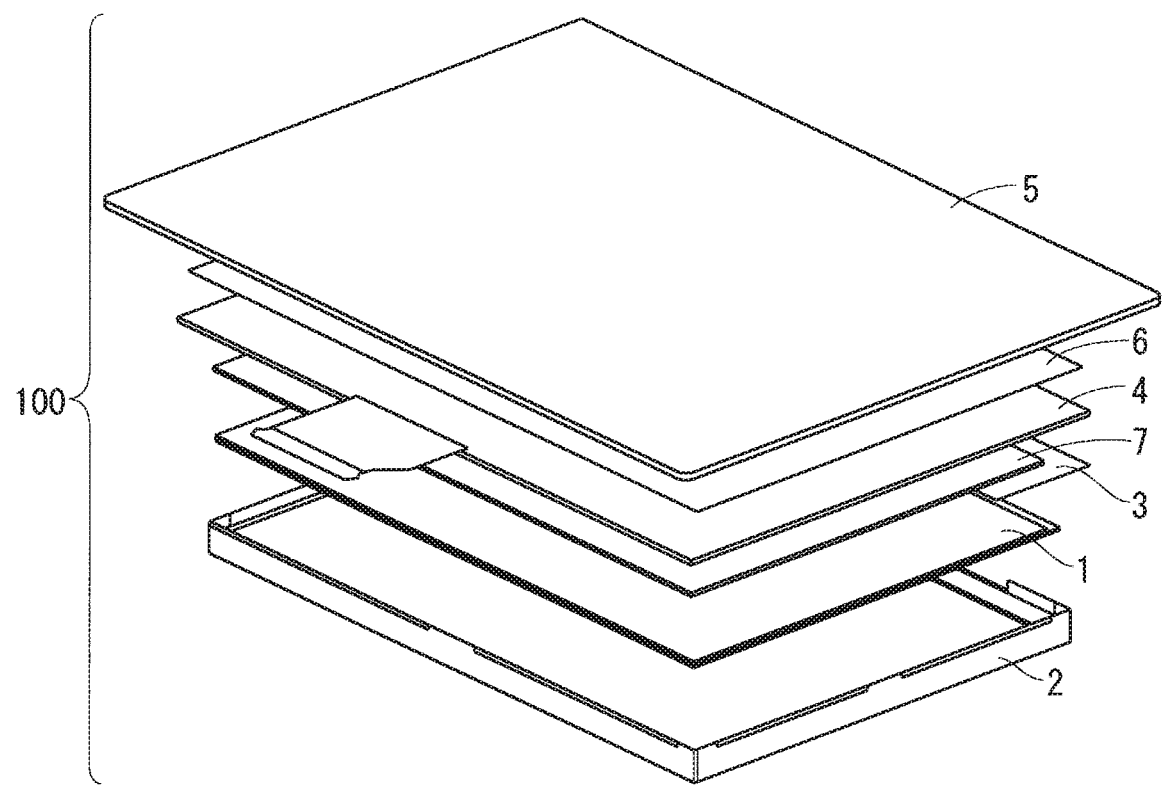
FIG. 1 is an exploded perspective view illustrating an example of a configuration of a display device according to Embodiment 1.
Figure 2:
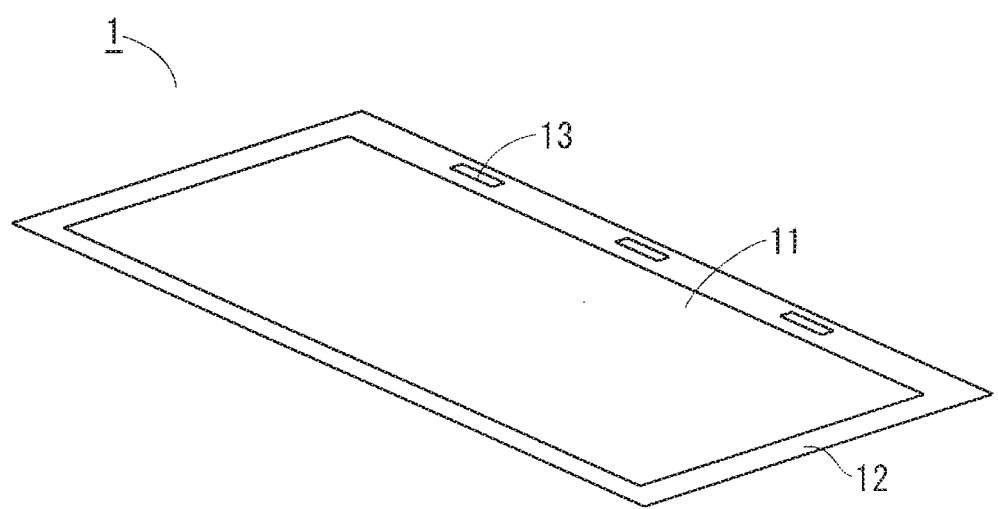
FIG. 2 is a diagram illustrating an example of a display panel according to Embodiment 1.
Figure 3:
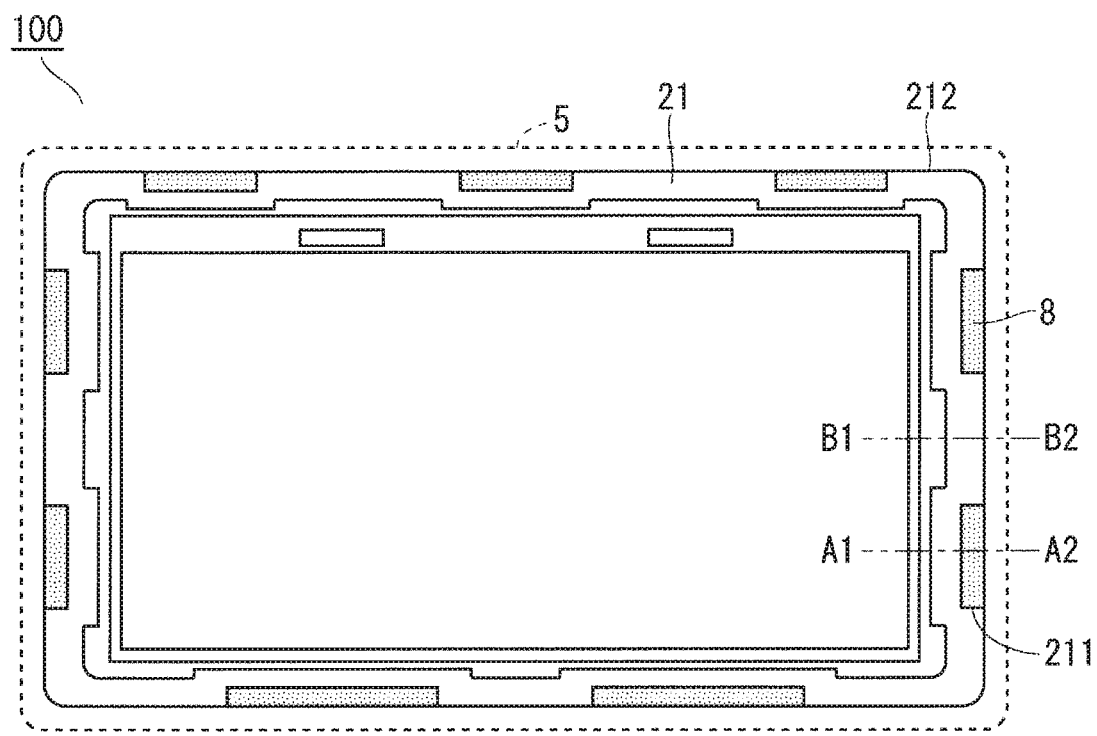
FIG. 3 is a top view illustrating the example of the configuration of the display device according to Embodiment 1.
Figure 4:
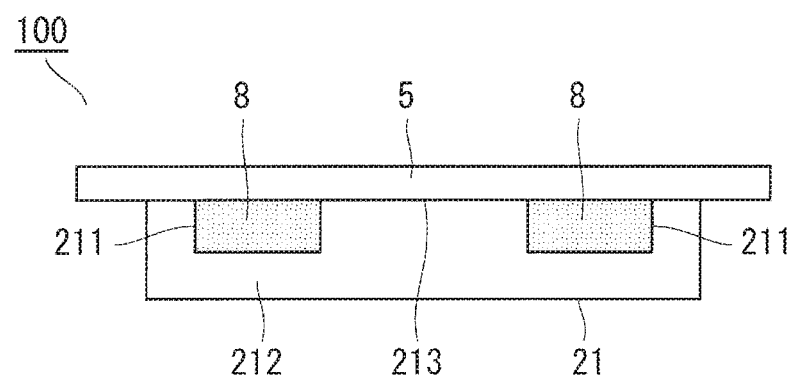
FIG. 4 is a side view illustrating the example of the configuration of the display device according to Embodiment 1.
Figure 5:
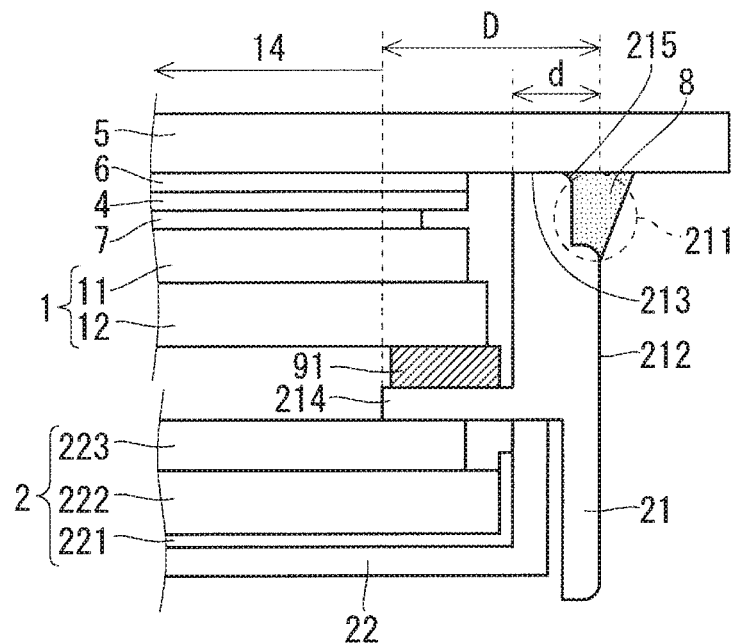
FIG. 5 is a cross-sectional view taken along line A1-A2 of FIG. 3.
Figure 6:
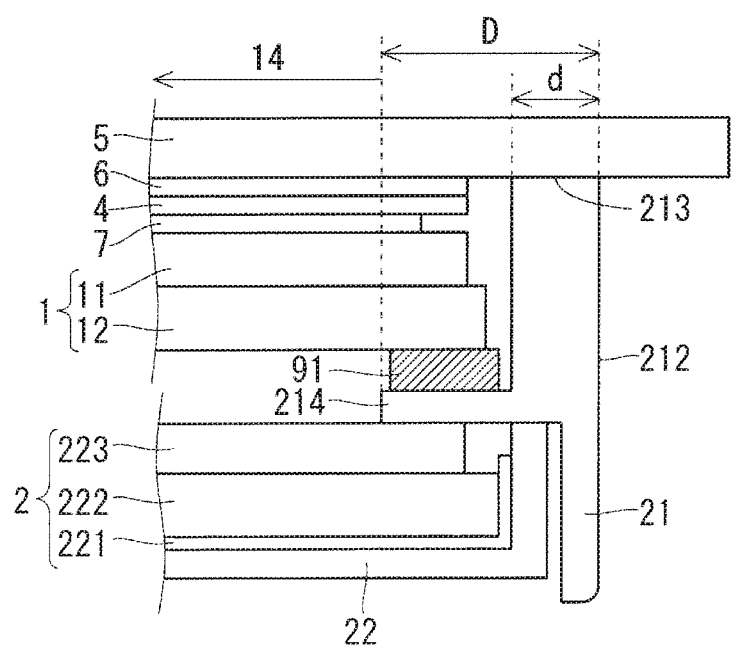
FIG. 6 is a cross-sectional view taken along line B1-B2 of FIG. 3.

FIG. 1 is an exploded perspective view illustrating an example of a configuration of a display device 100 according to Embodiment 1. FIG. 2 is a diagram illustrating an example of a display panel 1. FIG. 3 is a top view illustrating the example of the configuration of the display device 100. FIG. 4 is a side view illustrating the example of the configuration of the display device 100. FIG. 5 is a cross-sectional view taken along line A1-A2 of FIG. 3. FIG. 6 is a cross-sectional view taken along line B1-B2 of FIG. 3.

As illustrated in FIG. 1, the display device 100 includes a display panel 1, a backlight 2, a circuit board 3, a touch panel 4, a protective member 5, a bonding material 6, and a bonding material 7. In the following, each component comprising the display apparatus 100 will be described.

<Display Panel 1>

As illustrated in FIG. 2, the display panel 1 is a liquid crystal display panel, and includes a first substrate 11 and a second substrate 12. The first substrate 11 is configured by including a color filter (CF), a light shielding layer, counter electrodes, and the like on an insulating substrate such as glass. The second substrate 12 is configured by providing a thin film transistor (TFT) serving as a switching element, a pixel electrode, and the like on an insulating substrate such as glass.

In addition, the display panel 1 includes, a spacer (not shown) for maintaining a distance between the first substrate 11 and the second substrate 12, a sealing material (not shown) for bonding the first substrate 11 and the second substrate 12, liquid crystal (not show) sandwiched between the first substrate 11 and the second substrate 12, a sealing material (not shown) for an inlet through which liquid crystal is injected, an alignment film (not shown) for aligning liquid crystal, polarizing plates (not shown) disposed on the opposite sides of the liquid crystal of the first substrate 11 and the second substrate 12, a driving IC (Integrated Circuit) 13 disposed on the outer periphery of the second substrate 12, and the like.

The driving IC 13 may be disposed on a tape-shaped wiring member connected to the outer periphery of the second substrate 12. Examples of the tape-shaped wiring member include Tape Carrier Package (TCP) and Chip on Film (COF).

<Backlight 2>

As illustrated in FIGS. 5 and 6, the backlight 2 includes a light source (not shown), a light guide plate 222, an optical sheet 223, a reflection sheet 221, a backlight frame 22, and the like. The backlight 2 irradiates light toward the display panel 1 from the side facing the display surface of the display panel 1, specifically, the second substrate 12 side.

The light source emits light to the side surface of the light guide plate 222. Examples of the light source include RGB (R: red, G: green, B: blue) point light sources, LEDs of luminescence colors other than RGB, fluorescent tube lamps, or the like. When point light sources are used, for the light source substrate on which the point light sources are mounted, a general glass epoxy resin-based substrate or a flexible flat cable may be employed, or a substrate based on metal such as aluminum or ceramic for enhancement in heat dissipation may be employed.

The light guide plate 222 has an emission surface from which light incident from the side surface is emitted toward the display panel 1, and a counter-emission surface that faces the emission surface. The light guide plate 222 is made of a transparent acrylic resin, polycarbonate resin, glass, or the like. A scattering dot pattern or a prism shape is formed on at least one of the emission surface and the counter-emission surface of the light guide plate 222 for adjusting the in-plane light intensity distribution or the emission direction.

The optical sheet 223 is provided on the emission surface of the light guide plate 222, and adjusts the intensity distribution and the emission angle of light emitted from the emission surface of the light guide plate 222. A lens sheet for condensing, a diffusion sheet for uniforming light, a viewing angle adjustment sheet for adjusting luminance in the viewing angle direction, and the like are included as the optical sheet 223, and a required number of the optical sheets 223 are disposed in accordance with the purpose.

The reflection sheet 221 is provided at a position facing a surface other than the light emission surface of the light guide plate 222, specifically, the counter-emission surface and the side surface. The light emitted from the counter-emission surface and side surface of the light guide plate 222 is reflected on the reflection sheet 221 and returns to the light guide plate 222.

The backlight frame 22 positions and holds the light source, the light source substrate, the reflection plate 222, the optical sheet 223, and the reflection sheet 221. In order to conduct the heat dissipated from the light source, metal having high thermal conductivity is desirably used for the backlight frame 22. The use of aluminum or aluminum alloy, that are particularly high in thermal conductivity, for the backlight frame 22 efficiently dissipates the heat dissipated from the light source and prevents heat from accumulating in the backlight 2.

<Frame 21>

The frame 21 has an opening through which light emitted from the backlight 2 passes. Further, the frame 21 positions and holds the display panel 1 and the protective member 5 so that the display panel 1 is disposed at a position facing the backlight 2 and the protective member 5 is disposed on the surface of the display panel 1. Specifically, the frame 21 encloses the display panel 1 and supports the outer periphery of the protective member 5 from the lower side which is the display panel 1 side.

For the material of the frame 21, metal such as aluminum, stainless steel, or iron, or a resin material such as polycarbonate (PC) or acrylonitrile butadiene styrene (ABS) can be used.

In general, although the frame 21 and the backlight frame 22 are fixed to each other in an engagement structure with a claw, or by screwing, hut the frame 21 and the backlight frame 22 may be structurally integrated. The display panel 1, the backlight 2, the circuit board 3, and the like are held by the frame 21 and the backlight frame 22.

<Circuit Board 3>

The circuit board 3 controls the display panel 1 and the light source by electrical input/output signals. In practice, the circuit board 3 has a copper pattern formed on a glass epoxy substrate or the like, and electronic components are mounted on the copper pattern by solder. Although the circuit board 3 is disposed and fixed mainly on the rear side of the display device 100, specifically, the side where light is not emitted, the circuit board 3 may be constructed by mounting electronic components on the Flexible Printed Circuit (FPC) in which wiring is formed on a film-like base material connected to the display panel 1.

In addition, in order to protect the circuit board 3 from external pressure or static electricity, a protective cover (not shown) made of metal such as aluminum, stainless steel, or a galvanized steel sheet, or a thin film resin such as Polyethylene terephthalate (PET) may be attached to the circuit board 3. When using a metal protective cover, a measure for insulation in which a resin sheet such as PET is plastered on the circuit board 3 side of the protective cover is desirably taken to avoid electrical contact with the circuit board 3 or the electronic components provided on the circuit board 3.

<Touch Panel 4>

The touch panel 4 includes a circuit in which a transparent electrode is formed on a transparent substrate. The touch panel 4 converts information on the position coordinates input by the user into an electrical signal, and transmits the electrical signal to the control circuit of the final product via an output wiring part connected to the end. For the output wiring part, FPC in which wiring formed on a film-like base material is used because of the flexibility of connection due to its thinness and flexibility, but different materials or structures may be used as long as they have equivalent functions and characteristics.

<Protective Member 5>

The protective member 5 is provided to prevent damage, deformation, wear, dirt, etc. due to pressure or contact from the input surface side of the touch panel 4. Specifically, the protective member 5 is disposed on the display surface of the display panel 1 via bonding materials 6 and 7 that consist a first bonding member, and the outer periphery protrudes from the display panel 1. The protective member 5 is made of a transparent material such as glass or plastic. It should be noted that, on the periphery of the front surface or the rear surface of the protective member 5 can be subjected to printing light shielding or a design purpose.

<Bonding Materials 6, 7>

The bonding materials 6 and 7 are transparent bonding sheets for optical applications having a maximum thickness of about 0.5 mm. The bonding material 6 bonds the touch panel 4 and the protective member 5 together. The bonding material 7 bonds the display panel 1 and the touch panel 4 together. With such a configuration, the display device 100 with excellent visibility even under external light is obtained.

<Characteristic Structure of Display Device 100>

As illustrated in FIGS. 4 and 5, the frame 21 has a concave portion 211 cut out from the upper surface 213, which is a surface in contact, with the protective member 5, toward the outer side surface 212. The concave portion 211 is filled with an adhesive 8 that adheres and fixes the protective member 5 and the frame 21 together. The adhesive 8 is made of a resin material that is cured by ultraviolet (UV), heat, moisture, or the like, and has viscosity before curing.

A curved surface portion 215 is formed from the upper surface 213 toward the surface which forms the concave portion 211 of the frame 21. As illustrated in FIGS. 3 to 6, the frame 21 includes a portion where a plurality of concave portions 211 are formed and a portion where the concave portions 211 are not formed.

As illustrated in FIGS. 5 and 6, the frame 21 has a protrusion 214 that is parallel to the display panel 1 and protruding inside. The protrusion 214 supports the display panel 1 via a double-sided bonding tape 91 that is a second bonding member from the side opposite to the display surface of the display panel 1. That is, the display panel 1, the touch panel 4, and the protective member 5 are supported by the frame d the double-sided bonding tape 91.

Figure 12:
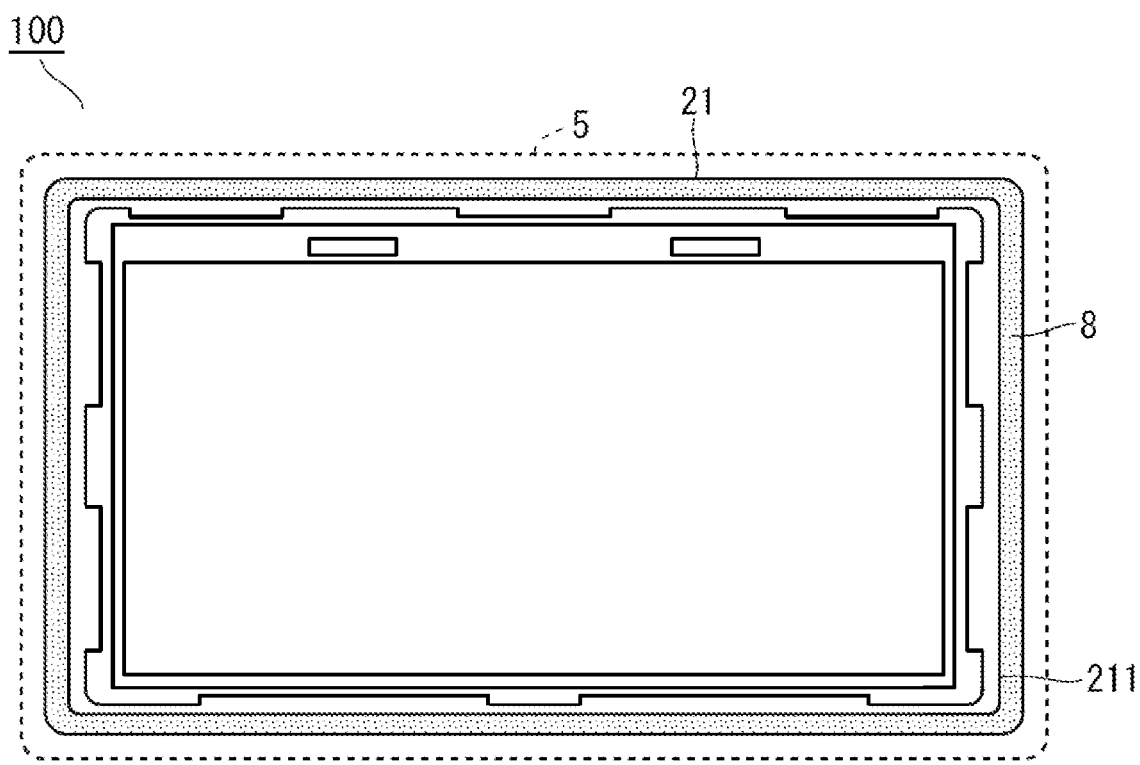
FIG. 12 is a top view illustrating an example of the configuration of a display device having a concave portion formed over an entire circumference of the frame.

In the above description, the case where the concave portions 211 are formed at a plurality of locations of the frame 21 has been described. However, the present disclosure is not limited thereto. For example, the concave portion 211 may be formed over the entire circumference of the frame 21, as shown in FIG. 12.

<Effect>

In the display device 100 according to Embodiment 1, the frame 21 is provided with the concave portions 211 cut out from the upper surface 213 toward the side surface 212. Therefore, the width d illustrated in FIGS. 5 and 6 can be made narrower than that in a structure in which concave portion is provided only on the upper surface of the frame (see, Japanese Patent No. 6294967, for example). The width d can be narrowed to a width that can ensure the molding and secure adhesive strength of the frame 21, and accordingly, the width D from the end of a display area 14 to the end of the frame 21 is also narrowed; therefore, the frame of the display device 100 can be narrowed.

The adhesive 8 also contacts the rear surface of the protective member 5 when the concave portions 211 of the frame 21 is filled; therefore, the protective member 5 can be fixed to the frame 21 with a secured bonding area.

When the concave portions 211 is provided in the thick portion of the frame 21, a wide bonding area and the strength of the frame 21 can be secured. The structure in which the concave portions 211 are provided at a plurality of locations of the frame 21 can reduce the amount of the adhesive 8 used compared to the structure in which the concave portion 211 is provided over the entire circumference of the frame 21; therefore, an effect that reduces accompanying cost is exhibited. Meanwhile, the structure in which the concave portion 211 is provided over the entire circumference of the frame 21 can reduce the number of times the adhesive 8 is applied; therefore the manufacturing processing of the display device 100 can be shortened.

As illustrated in FIGS. 5 and 6, the protective member 5 and the touch panel 4 are bonded with the bonding material 6, the touch panel 4 and the display panel 1 are bonded with the bonding material 7, and the display panel 1 and the protrusion 214 of the frame 21 are bonded with the double-sided bonding tape 91. By adopting such a configuration, the protective member 5 does not fall off during conveyance. Therefore, conveyance of the display device to the next process in the manufacturing processing is ensured without waiting for the adhesive 8 to be cured. In addition, the protective member 5 and the upper surface of the frame 21 are in contact with each other; therefore, the adhesive 8 filled in the concave portion 211 can be prevented from permeating the inside of the display device 100. As described above, according to Embodiment 1, the productivity of display device 100 can be improved.

In Embodiment 1, although, the display device 100 including the touch panel 4 has been described as an example, Embodiment 1 can also be applied to a display device that does not include a touch panel. In this case, the protective member 5 and the display panel 1 are bonded with a bonding material.

Embodiment 2

Figure 7:
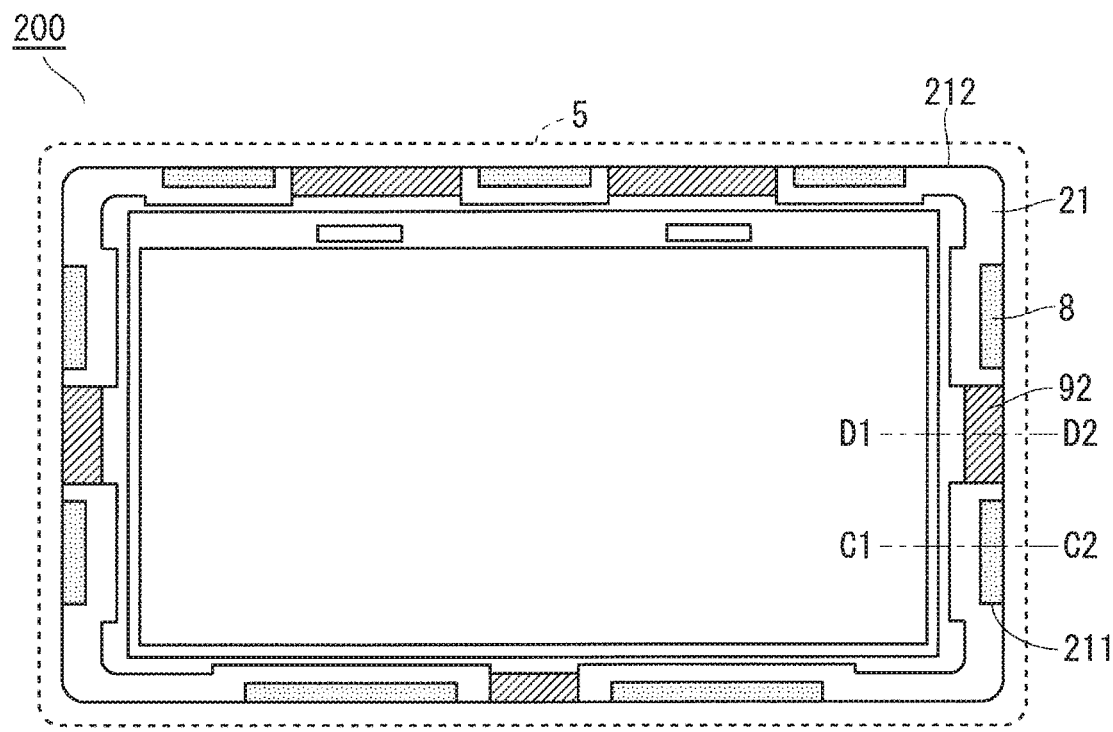
FIG. 7 is a top view illustrating an example of a configuration of a display device according to Embodiment 2.
Figure 8:
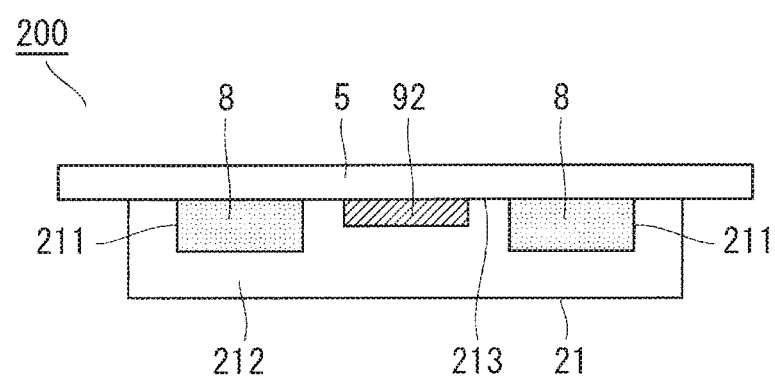
FIG. 8 is a side view illustrating the example of the configuration of the display device according to Embodiment 2.
Figure 9:
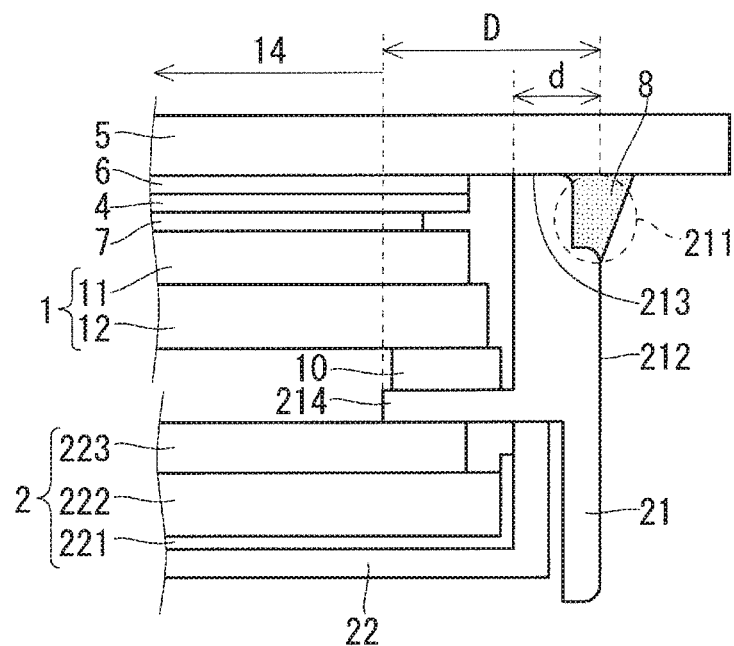
FIG. 9 is a cross-sectional view taken along line C1-C2 of FIG. 7.
Figure 10:
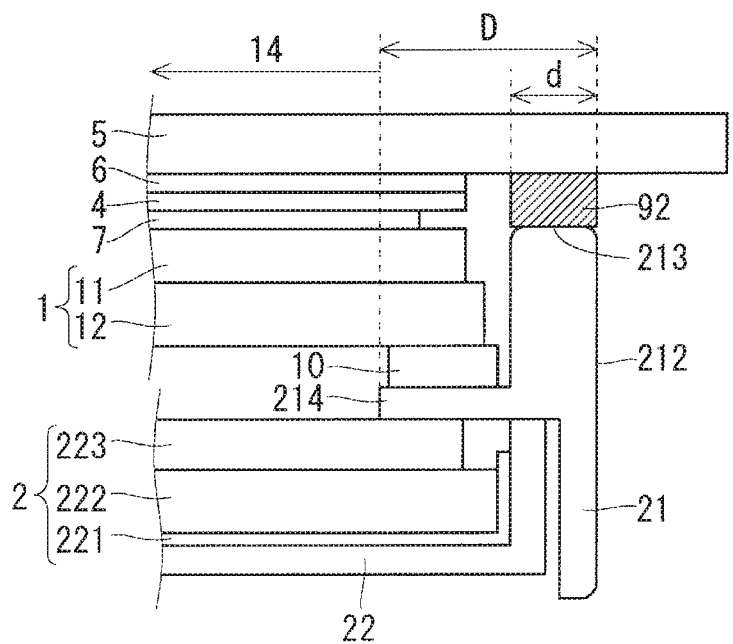
FIG. 10 is a cross-sectional view taken along line D1-D2 of FIG. 7.

FIG. 7 is a top view illustrating an example of a configuration of a display device 200 according to Embodiment 2. FIG. 8 is a side view illustrating the example of the configuration of the display device 200. FIG. 9 is a cross-sectional view taken along line C1-C2 of FIG. 7. FIG. 10 is a cross-sectional view taken along line D1-D2 of FIG. 7.

Embodiment 2 is characterized in that a cushion 10 is disposed between the display panel 1 and the protrusion 214 of the frame 21, and a double-sided bonding tape 92 is disposed between the protective member 5 and the frame 21. The double-sided bonding tape 92 is disposed between each concave portion 211 and bonds the protective member 5 and the frame 21 together. Other configurations are the same as those of the display device 100 according to Embodiment 1, and description thereof is omitted here.

From the above, according to Embodiment 2, by disposing the cushion 10 and the double-sided bonding tape 92, the stress on the display panel 1 is relieved, so that display unevenness due to the stress is reduced.

Embodiment 3

The case where the curved surface portion 215 is formed from the upper surface 213 toward the surface which forms the concave portion 211 of the frame 21 has been described.

Figure 11:
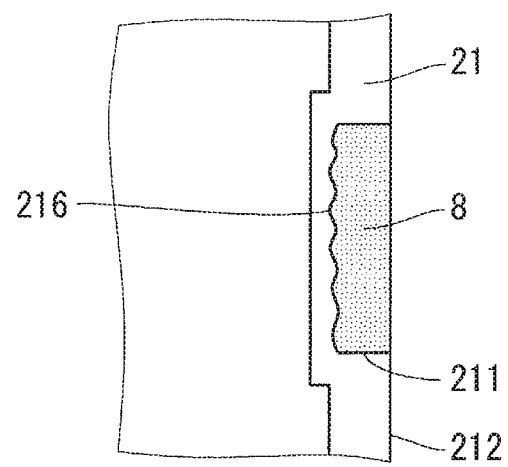
FIG. 11 is a top view illustrating an example of a concave portion according to Embodiment 3.

As illustrated in FIG. 11, Embodiment 3 is characterized in that, instead of the curved surface portion 215, the surface which forms the concave portion 211 has a wave portion 216 having an uneven shape. The wave portion 216 is not limited to the surface illustrated in FIG. 11, and may be any surface as long as it forms the concave portion 211. Other configurations are the same as Embodiment 1 and Embodiment 2, and description thereof is omitted here.

From the above, according to Embodiment 3, instead of the curved surface portion 215 described in Embodiment 1, the wave portion 216 is provided on the surface which forms the concave portion 211, thereby the adhesive 8 is prevented from spreading between of the upper surface 213 of the frame 21 and the protective member 5, and prevention of the adhesive 8 from permeating the inside of the display device 100 is ensured.

It should be noted that Embodiments can be arbitrarily combined and can be appropriately modified or omitted without departing from the scope of the disclosure.

While the disclosure has been shown and described in detail, the foregoing description is in all aspects illustrative and not restrictive. It is therefore understood that numerous modifications and variations can be devised without departing from the scope of the disclosure.

What is claimed is:

1. A display device comprising: a display panel; a protective member has a lower side disposed on a display surface of the display panel via a first bonding member, wherein an outer periphery of the protective member protrudes beyond an outer edge of the display panel in a cross-sectional view; and a frame enclosing the display panel and supporting the outer periphery of the protective member from the lower side which is on a side of the display panel, wherein the frame has a concave portion in a portion of an outer side surface of the frame, the concave portion being recessed toward an inner side surface of the frame opposite to the outer side surface in the cross-sectional view, wherein an uppermost surface of the frame in the cross-sectional view is in contact with the lower side of the protective member, and an adhesive adhering the protective member and the frame together is filled in the concave portion.

2. The display device according to claim 1, wherein
a curved surface portion is formed in the uppermost surface of the frame toward the outer side surface of the frame.

3. The display device according to claim 2, wherein
the frame is parallel to the display panel and has a protrusion protruding inside, and
the protrusion supports the display panel via a second bonding member from a side opposite to the display surface of the display panel.

4. The display device according to claim 3, wherein
the frame has a plurality of the concave portions.

5. The display device according to claim 4, further comprising
an adhesive tape provided between each of the concave portions and adhering the protective member and the frame together.

6. The display device according to claim 3, wherein
the concave portion is formed over an entire circumference of the frame.

* * * * *